United States Patent [19]

Hitt et al.

[11] 4,389,674

[45] Jun. 21, 1983

[54] PREAMPLIFIER FOR LOW VOLTAGE SIGNALS IN THE PRESENCE OF HIGH VOLTAGE NOISE

[75] Inventors: James J. Hitt, Willow Grove; Scott L. Kern, Perkasie, both of Pa.

[73] Assignee: Leeds & Northrup Company, North Wales, Pa.

[21] Appl. No.: 240,660

[22] Filed: Mar. 5, 1981

[51] Int. Cl.³ .................... H04N 3/14; H03K 5/159
[52] U.S. Cl. .................................. 358/213; 307/352
[58] Field of Search ............... 307/352, 490; 358/213, 358/212

[56] References Cited

U.S. PATENT DOCUMENTS

| | | | |
|---|---|---|---|
| 3,949,162 | 4/1976 | Malueg | 358/213 |
| 4,079,423 | 3/1978 | Diehl | 358/213 |
| 4,283,742 | 8/1981 | Izumita et al. | 358/213 |

Primary Examiner—John S. Heyman
Assistant Examiner—Timothy P. Callahan
Attorney, Agent, or Firm—Harold Huberfeld; Raymond F. MacKay

[57] ABSTRACT

A preamplifier for use primarily with a solid state line scanner for amplifying the signal output from the scanner and suppressing the noise from switching spikes featuring a cascode-connected input stage in a preamplifier having its gain stabilized by negative feedback.

7 Claims, 1 Drawing Figure

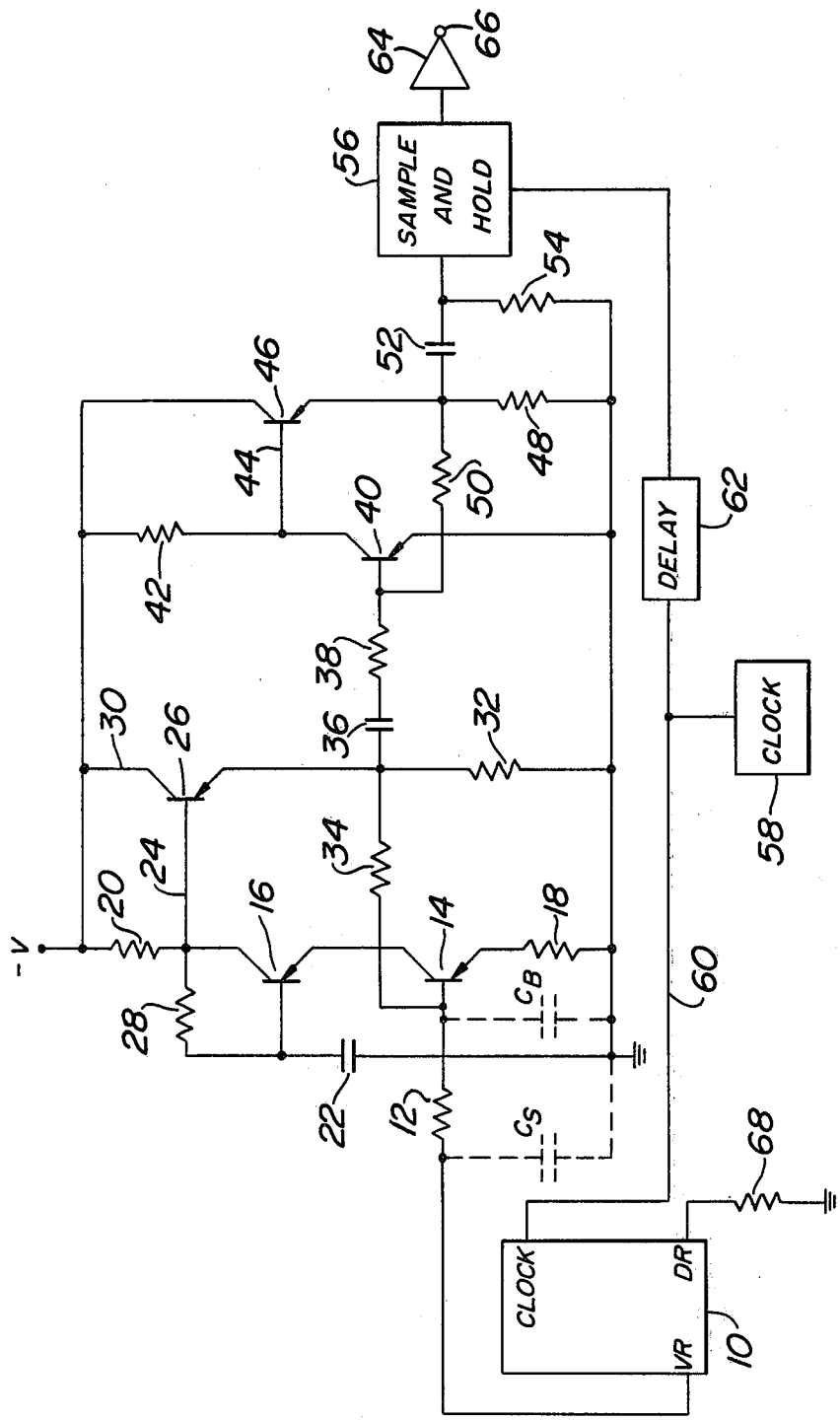

PREAMPLIFIER FOR LOW VOLTAGE SIGNALS IN THE PRESENCE OF HIGH VOLTAGE NOISE

BACKGROUND OF THE INVENTION

This invention relates to amplifiers suitable for operation with signal sources in which the signal to be amplified is in the form of pulses having low signal levels in the presence of switching transient signals of short duration and large level.

Solid state line scanners have been used in applications such as optical character recognition and optical recognition in which generally the level of illumination detected by the line scanner is relatively large. When the line scanner is utilized in a portable radiation measuring system such as disclosed in copending application, Ser. No. 197,453, filed Oct. 16, 1980, MICROPROCESSOR DIRECTED OPTICAL PYROMETER, by Alexander H. Clark, John E. O'Neil, and Albert S. Tenney III, the levels of illumination vary widely. In order to expand the span of the measurement, the solid state line scanner is driven by an adjustable frequency clock. When the level of illumination is low, the frequency at which the line scanner is operated is reduced so that a distinguishable signal may be obtained from the line scanner.

In order to reduce the effect of switching transients in the output signal, line scanners manufactured by EG&G Reticon and identified as their G Series Solid State Line Scanners, incorporate photodiodes and dummy diodes. The purpose of the dummy diode is so that switching transients can be eliminated by connecting an amplifier to be differentially responsive to signals generated by the photodiodes and the dummy diodes. As an alternative approach to eliminating the problem of the switching transient noise, it has been proposed that the output from the line scanner be appplied to an integrating circuit coupled to a sample and hold amplifier to reduce the effect of the switching transient noise.

BRIEF SUMMARY OF THE INVENTION

In this invention the output signal from the solid state line scanner is applied as an input to a cascode-coupled stage of a preamplifier through an input resistance. The use of the input resistance, while attenuating to some extent the low level signal from the solid state line scanner, provides in conjunction with the stray capacitance associated with the input resistor and the stray capacitance associated with the output of the solid state line scanner, a tuned low pass filter which serves the purpose of permitting the low level measurement signals to be amplified while at the same time reducing the effect of the switching transients by the filtering action of the input low pass filter. The cascode connection also reduces the Miller capacitance associated with the input transistor and therefore the time constant that would be introduced if the cascode connection were not used. Thus the response of the preamplifier is extremely fast which is required to amplify the pulse output signals from the scanner.

It is an object of this invention to provide an amplifier suitable for use in conjunction with the solid state line scanner responding to a low level high frequency signal from the line scanner while eliminating high frequency high level noise produced by the switching from cell to cell in the scanner.

This and other objects will be obvious from the description when taken in conjunction with the description of the FIGURE.

BRIEF DESCRIPTION OF THE DRAWING

The FIGURE is a schematic diagram of an amplifier connected in accordance with this invention.

Referring to the FIGURE, a solid state line scanner 10 is shown as having an input clock terminal, an output terminal VR and an output terminal DR. In accordance with the nomenclature used with respect to the terminal designations by EG&G Reticon for their G Series Solid State Line Scanners, the output terminal VR is a video recharge terminal and the output terminal DR is the dummy recharge terminal. Other terminals (not shown) are connected in conventional fashion for the operation of the solid state line scanner 10 include positive and negative power supplies and signal common.

The solid state line scanner 10 contains a series of cells consisting of a photodiode and a dummy diode, both with an associated storage capacitance. The line scanner 10 may have 128, 256, 512, or 1024 cells. When a solid state line scanner is subjected to illumination, the photodiode discharges from its previously charged state its corresponding capacitance at a rate that is dependent upon the level of illumination. In order to obtain a signal representative of the level of illumination on any of the particular photodiodes in the scanner 10, a solid state switch operated by the clock input applied to the clock input terminal sequentially connects each capacitance to a video recharge line whereby the capacitance is charged by a current flow through the video recharge line to a fixed voltage level. Thus, current supplied to the video recharge line flows through the output terminal VR through an input resistor 12 to the base of an input transistor 14 of a cascode-connected pair of transistors including the input transistor 14 and a transistor 16. The emitter of the input transistor 14 is connected by way of an emitter resistor 18 to signal common. In typical cascode configuration, the collector of the transistor 14 is directly connected to the emitter of the transistor 16 and the collector of the transistor 16 is connected to a voltage source, $-V$, by way of a load resistor 20.

The video recharge current signal appearing at the output terminal VR of the line scanner 10 is accompanied by switching transients capacitively coupled into the video recharge line by the multiplex switches. The short duration switching transients appearing at the output terminal VR would mask the signal appearing at the terminal when the levels of illumination were small. In order to allow the scanner 10 to operate at low illumination levels, the short duration switching transients having a high frequency content are effectively removed by a tuned low pass filter arrangement comprising the input resistor 12 taken in conjunction with a stray capacitance $C_s$ and a stray capacitance $C_b$. Inasmuch as these capacitances are stray capacitances, they have been illustrated in the FIGURE by dotted lines. In view of the filtering, the signal at the base of the input transistor 14 is effectively the signal representing the video charging current without the switching transients. The output from the input transistor 14 appearing at the collector of the input transistor 14 is directly connected to the emitter of the transistor 16 as an input signal. The base of the transistor 16 is effectively tied to signal common with respect to the AC component of the signal by a capacitor 22. With the base of transistor 16 tied to signal common, the voltage variations required at the emitter of the transistor 16 to drive the transistor 16 are very small to effect a large output change of the same phase at the collector of the transistor 16.

Thus the Miller capacitance effect between the input of the transistor 14 and the output of the transistor 16 is greatly reduced as the large output voltage swing of the collector of the transistor 16 has been isolated from the input base of the transistor 14.

The output from the transistor 16 appearing at its collector is connected by a conductor 24 to the base of a transistor 26. The output from the transistor 16 is also connected by way of a negative feedback resistor 28 to the base of the transistor 16. The feedback resistor 28 provides negative feedback for stabilizing the DC operating point of the transistor 16 and to maintain amplifier linearity. The transistor 26 operates as an emitter follower having its collector connected to an operating source of voltage −V by way of a conductor 30 and its emitter connected through a load resistor 32 to signal common. Thus, the transistor 26 operating as an emitter follower stage will have a low output impedance at its emitter. The signal output appearing at the emitter of transistor 26 is fed back to the base of the input transistor 14 by a feedback resistor 34. The gain of the preamplifier stages including the transistors 14, 16, and 26 is established by the ratio of the magnitude of the resistance of the feedback resistor 34 to the input resistor 12.

In addition to the feedback connection from the emitter of the transistor 26, the output signal is coupled through a coupling capacitor 36 and a resistor 38 to the base of a transistor 40. The emitter of the transistor 40 is directly connected to signal common and the collector of the transistor 40 is connected through a load resistor 42 to an appropriate source of voltage, −V. The output from the transistor 40 appearing at the collector of the transistor 40 is directly coupled through a conductor 44 to the base of a transistor 46. The transistor 46 is connected as an emitter follower stage in which the collector of the transistor 46 is connected to an appropriate voltage source, −V, and the emitter of the transistor 46 is connected through a load resistor 48 to signal common. The signal output of the emitter follower connected transistor 46 is fed back through a negative feedback resistor 50 to the base of the transistor 40. The signal output from the transistor 46 is connected through a coupling capacitor 52 to an output resistor 54 and thence to a sample and hold circuit 56 of conventional design.

In operation a series of clock pulses are produced by a clock 58. The clock pulses applied to the clock input terminal of the solid state line scanner 10 by way of a conductor 60 causes the solid state line scanner to sequentially scan the capacitances associated with each photodiode to produce at the video recharge output terminal VR a series of current pulses representative of the magnitude of the illumination upon each of the cells in the solid state line scanner 10. This series of pulses is applied through the input resistor 12 to the high impedance input of the cascode-connected input transistor 14 and transistor 16 to produce a series of rapidly rising short duration pulses representative of the illumination falling upon the individual cells of the line scanner 10. The input current pulses appearing at the base of input transistor 14 are amplified and converted to a voltage pulse at the low impedance output of the transistor 26. This voltage signal is in turn amplified by the transistors 40 and 46 to produce an amplified signal applied to the sample and hold circuit 56.

The sample and hold circuit 56 is triggered by the clock pulses produced by the clock 58. Introduced between the clock 58 and the input to the sample and hold circuit 56 is a delay circuit 62 so that the sample and hold circuit is activated at the time that the amplified pulses from the transistor 46 reach their peak value.

The signal from the sample and hold circuit 56 is shown applied by way of an amplifier 64 to an output terminal 66. The output appearing at the output terminal 66 may be applied to any system for measuring the level of illumination appearing on each of the individual cells of the scanner 10 during each scan. Where the measuring system is of the digital type the amplifier 64 may be used to feed an analog to digital converter.

When the scanner 10 is used to measure levels of illumination, the span of illumination levels that can be measured may be increased by varying the frequency of the clock pulses produced by the clock 58. Thus, the clock 58 may be of the type having a variable frequency output that may be manually set or automatically set in accordance with the level of output at the output terminal 66. When the level of illumination on the cells of the scanner 10 is low, the clock pulses will be of low frequency to increase the discharge time for the photodiode in order that the photodiode will have sufficient time to measurably discharge its associated capacitance. On the other hand, when the level of illumination is high, it is necessary to operate the clock at a higher frequency so that the capacitances associated with a photodiode will not be completely discharged in the time period of each successive scan. In a typical application, the clock pulses varied from 1 to 5 kilohertz.

While the output terminal DR of the scanner 10 is provided by the manufacturer to assist in eliminating the effect of the switching transients capacitively coupled into the output terminal VR, it has been found that with this invention it is not necessary to take such precautions and accordingly the output terminal DR is merely coupled to signal common through a resistor 68.

In one embodiment of this invention it was desired to use the solid state line scanner 10 in a portable automatic optical pyrometer of the disappearing filament type where some of the cells of the scanner 10 were illuminated by radiation from a target area and other cells were illuminated by radiation from the filament of one optical pyrometer lamp. Among the requirements of this application was that the preamplifier have a high input sensitivity to operate with the output of the scanner 10, an extremely fast rise time to accommodate input signals having rise times in the order of tens of nanoseconds, having the ability to reject the noise spikes appearing at the video recharge terminal VR, a low power demand to reduce the drain on the battery power source powering the portable pyrometer, operate at low signal input levels and have a low input capacitance.

In order to provide the foregoing requirements it was found that the circuit shown in the FIGURE would provide the desired characteristics when the transistors 14, 16, 26, 40, and 46 were type 2N4209, resistor 12 was 47K, resistor 18 was 1K, resistor 20 was 12K, resistor 28 was 68K, resistor 32 was 3.3K, resistor 34 was 220K, and capacitor 22 was 0.001 μFds. With these components the current drawn from the −10 volt power supply −V was 2 ma and the amplifier had a gain of five as determined by the values of resistors 12 and 34.

There has been provided a preamplifier circuit for use with a solid state line scanner having improved noise reduction capabilities while retaining a high speed of operation necessary to produce pulses in the 1 to 5 kilohertz range from low level signals while operating with low power demands to make possible apparatus that features practicability as well as high sensitivity and selectivity.

What is claimed is:

1. An improved illumination detecting image sensing device comprising:
   a source of clock pulses;
   a solid state line scanner having a plurality of photodiodes, a clock pulse input connected to said source of clock pulses for scanning said photodiodes to produce a series of switched signals representative of the illumination level of said photodiodes, a video recharge gate terminal at which said series of switched signals appear, and a dummy recharge gate terminal for producing a series of switched signals independent of said illumination;
   an input resistor;
   a single-ended preamplifier having an input and an output with said input connected to said video recharge gate terminal through said input resistor;
   sample and hold means having a signal input, a signal output, and a timing input with said signal input connected to said output of said preamplifier to hold at its signal output a signal level corresponding to the level of the signal applied to said signal input at the time that a pulse is applied to said timing input; and
   delay means connected between said source of clock pulses and said timing input of said sample and hold means to delay the sampling time of said sample and hold means until the signal from said preamplifier output has reached a maximum value.

2. Apparatus as claimed in claim 1 in which said dummy recharge terminal is connected to signal common.

3. Apparatus as claimed in claim 1 in which said single-ended preamplifier comprises a cascode-connected amplifier.

4. Apparatus as claimed in claim 1 in which said single-ended preamplifier includes a transistor input stage with a base-emitter input circuit with said base connected through said input resistor to said video recharge terminal and said emitter connected to signal common.

5. Apparatus as claimed in claim 4 in which said preamplifier includes a second transistor with the emitter collector circuit of said second transistor connected in series circuit relation with the collector-emitter circuit of said input transistor stage.

6. Apparatus as claimed in claim 5 in which said preamplifier includes a third transistor stage having its base connected to said collector of said second stage and an output from the emitter of said third stage connected in negative feedback relation to said base of said input stage.

7. Apparatus as claimed in claim 1 in which said clock source of pulses has an adjustable pulse repetition frequency.

* * * * *